(12) United States Patent
Fujimoto et al.

(10) Patent No.: US 10,147,797 B2
(45) Date of Patent: Dec. 4, 2018

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventors: Takumi Fujimoto, Matsumoto (JP); Naoki Kumagai, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/583,991

(22) Filed: May 1, 2017

(65) Prior Publication Data

US 2017/0236914 A1 Aug. 17, 2017

Related U.S. Application Data

(63) Continuation of application No. PCT/JP2015/085147, filed on Dec. 16, 2015.

(30) Foreign Application Priority Data

Jan. 16, 2015 (JP) .................. 2015-006393

(51) Int. Cl.
*H01L 29/45* (2006.01)
*H01L 21/28* (2006.01)
*H01L 29/417* (2006.01)
*H01L 29/78* (2006.01)
*H01L 21/04* (2006.01)
*H01L 29/16* (2006.01)

(Continued)

(52) U.S. Cl.
CPC .......... *H01L 29/45* (2013.01); *H01L 21/0485* (2013.01); *H01L 21/28* (2013.01);
(Continued)

(58) Field of Classification Search
CPC . H01L 29/45; H01L 29/7802; H01L 29/1608; H01L 21/0485
See application file for complete search history.

(56) References Cited

U.S. PATENT DOCUMENTS 5,278,099 A 1/1994 Maeda
7,977,154 B2 * 7/2011 Koshka ............. H01L 21/02378
257/E21.054

(Continued)

FOREIGN PATENT DOCUMENTS

JP S62-55929 A 3/1987
JP 6-151608 5/1994
(Continued)

OTHER PUBLICATIONS

Japanese Office Action dated Jul. 10, 2018 in corresponding Japanese Patent Application No. 2016-569267.

*Primary Examiner* — William Coleman
*Assistant Examiner* — W David Coleman

(57) ABSTRACT

A silicon carbide semiconductor device, including a silicon carbide semiconductor structure, an insulated gate structure, an interlayer insulating film formed on the insulated gate structure, a poly-silicon film formed on the interlayer insulating film, and a main electrode formed on the poly-silicon film and in electrical connection with the silicon carbide semiconductor structure. The insulated gate structure includes a gate insulating film, which is a silicon dioxide film contacting the silicon carbide semiconductor structure, and a gate electrode formed on the gate insulating film.

6 Claims, 5 Drawing Sheets

(51) Int. Cl.
*H01L 29/66* (2006.01)
*H01L 29/10* (2006.01)

(52) U.S. Cl.
CPC ........ *H01L 29/1608* (2013.01); *H01L 29/417* (2013.01); *H01L 29/41741* (2013.01); *H01L 29/66068* (2013.01); *H01L 29/78* (2013.01); *H01L 29/7802* (2013.01); *H01L 29/1095* (2013.01)

(56) References Cited

U.S. PATENT DOCUMENTS

| | | | | |
|---|---|---|---|---|
| 8,188,538 | B2 * | 5/2012 | Nakano | H01L 29/1608 257/330 |
| 9,666,676 | B2 * | 5/2017 | Ogino | H01L 29/1608 |
| 2002/0038891 | A1 | 4/2002 | Ryu et al. | |
| 2010/0193796 | A1 | 8/2010 | Nakano | |
| 2012/0132912 | A1 | 5/2012 | Suekawa et al. | |
| 2013/0075756 | A1 | 3/2013 | Arthur et al. | |
| 2014/0299890 | A1 | 10/2014 | Matocha et al. | |
| 2017/0194438 | A1 * | 7/2017 | Kumagai | H01L 29/1608 |
| 2017/0263746 | A1 * | 9/2017 | Tashima | H01L 21/02529 |

FOREIGN PATENT DOCUMENTS

| | | |
|---|---|---|
| JP | H06-283533 A | 10/1994 |
| JP | 2004-511101 A | 4/2004 |
| JP | 2010-171418 A | 8/2010 |
| JP | 2012-129503 A | 7/2012 |
| JP | 2014-514756 A | 6/2014 |

* cited by examiner

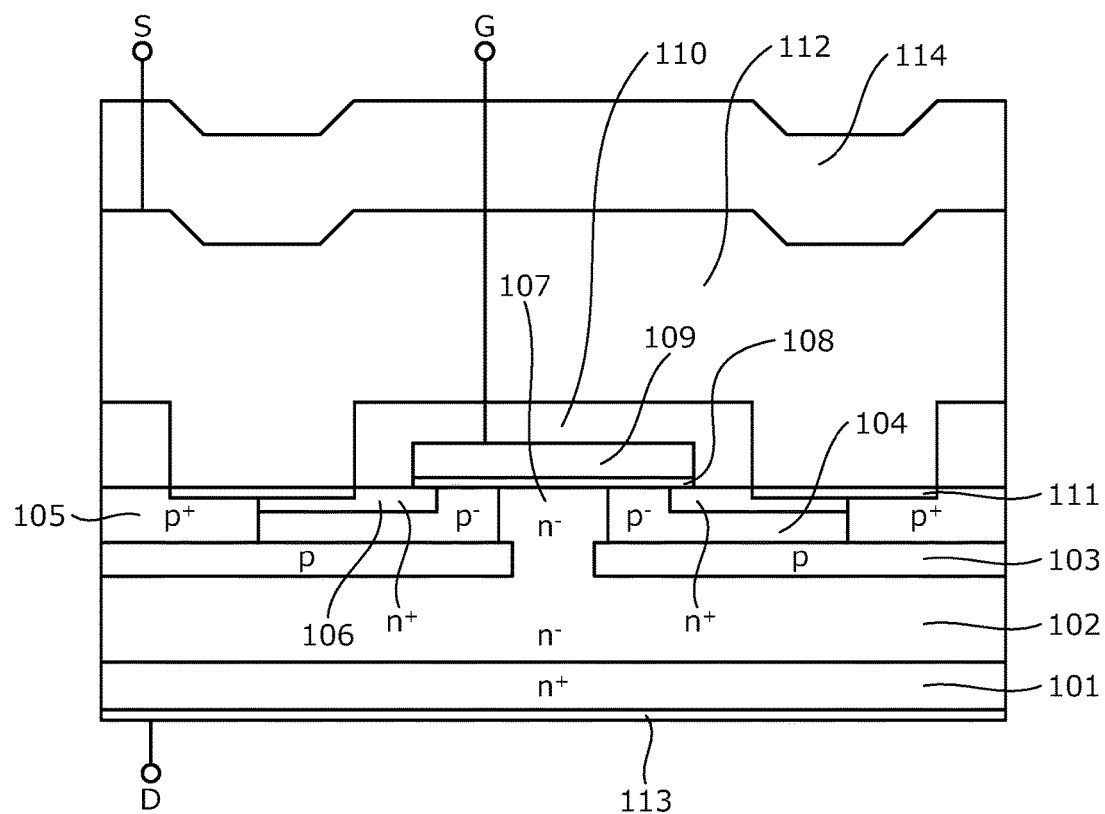

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This is a continuation application of International Application PCT/JP2015/085147, filed on Dec. 16, 2015, which claims priority from a Japanese Patent Application No. 2015-006393, filed on Jan. 16, 2015, the contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Silicon carbide (SiC) semiconductors have a breakdown field strength that is higher than that of silicon (Si) semiconductors and enable reduction of the ON resistance, which is inversely proportional to the breakdown field strength. Thus, silicon carbide semiconductors have recently gained attention as an optimal semiconductor in low-loss power devices. The development of, for example, SiC-power metal oxide semiconductor field effect transistors (MOSFETs) having a low ON resistance and fast switching speed as a semiconductor device that uses a silicon carbide semiconductor (hereinafter, silicon carbide semiconductor device) has progressed.

In metal oxide semiconductor (MOS) insulated gate silicon carbide semiconductor devices, a MOS gate structure is formed that has, as a gate insulating film, an oxide film ($SiO_2$ film) formed by thermal oxidation on a surface of a silicon carbide semiconductor base (semiconductor chip) constituted by a silicon carbide semiconductor substrate (semiconductor substrate formed using a silicon carbide semiconductor). Nonetheless, when the gate insulating film is formed on the surface of the silicon carbide semiconductor base by thermal oxidation, defects (interface state) are formed in large numbers near a junction interface of the gate insulating film and a silicon carbide semiconductor portion (hereinafter, $SiO_2$/SiC interface), making the interface state density (Dit) rise. Thus, the problems of decreased channel mobility, increased ON resistance, and increased conduction loss occur.

A method by which the interface state density of the $SiO_2$/SiC interface is reduced by forming an oxide film on a silicon carbide semiconductor substrate by thermal oxidation in an atmosphere that includes nitrous oxide ($N_2O$) or nitric oxide (NO) has been proposed as a method of solving these problems (for example, refer to Published Japanese-Translation of PCT Application, Publication No. 2004-511101). Formation of an oxide film that becomes a gate insulating film by thermal oxidation in an atmosphere that includes nitrous oxide or nitric oxide enables the interface state density of the $SiO_2$/SiC interface to be made $2\times10^{12}$ $cm^{-2}$ $eV^{-1}$ or lower, realizing high channel mobility. Therefore, in a SiC-MOSFET, a MOS gate structure may be formed that uses a good quality oxide film as a gate insulating film.

A SiC-vertical MOSFET of a planar gate structure will be described as an example of a structure of a conventional silicon carbide semiconductor device. FIG. 6 is a cross-sectional view of the structure of a conventional silicon carbide semiconductor device. In the conventional silicon carbide semiconductor device depicted in FIG. 6, on a front surface of an $n^+$-type silicon carbide substrate 101 that becomes an $n^+$-type drain region, an $n^-$-type silicon carbide epitaxial layer that becomes an $n^-$-type drift layer 102 and a $p^-$-type epitaxial semiconductor layer that becomes a $p^-$-type well layer 104 are sequentially deposited. Hereinafter, a stacked base formed by sequentially stacking the $n^-$-type drift layer 102 and the $p^-$-type well layer 104 on the $n^+$-type silicon carbide substrate 101 will be regarded as a silicon carbide semiconductor base.

On a front surface side (surface of a $p^-$-type well layer 104 side) of the silicon carbide semiconductor base, a MOS gate structure constituted by a p-type semiconductor region 103, the $p^-$-type well layer 104, a $p^+$-type contact region 105, an $n^+$-type source region 106, a gate insulating film 108, and a gate electrode 109 is provided. The p-type semiconductor region 103 and the $p^-$-type well layer 104 function as a base region. An interlayer insulating film 110 is provided so as to cover the gate electrode 109. In a contact hole that penetrates the interlayer insulating film 110 in a depth direction, a nickel silicide (NiSi) layer 111 forms an ohmic contact (electrical contact portion) with a silicon carbide semiconductor portion. On the interlayer insulating film 110 and the nickel silicide layer 111, a source electrode 112 is provided.

The source electrode 112 is electrically connected to the $p^+$-type contact region 105 and the $n^+$-type source region 106, via the nickel silicide layer 111 and is electrically insulated from the gate electrode 109 by the interlayer insulating film 110. On an entire rear surface (surface on the $n^+$-type silicon carbide substrate 101 side, i.e., rear surface of the $n^+$-type silicon carbide substrate 101) of the silicon carbide semiconductor base, a rear electrode 113 that becomes a drain electrode is provided. Reference numeral 107 is an $n^-$-type junction field effect transistor (JFET) region provided at a portion of the $n^-$-type drift layer 102 beneath the gate electrode 109 (a portion facing the gate electrode 109, via the gate insulating film 108) and between adjacent $p^-$-type well layers 104. Reference 114 is a passivation protective film.

A method of manufacturing the conventional silicon carbide semiconductor device will be described. First, on the front surface of the $n^+$-type silicon carbide substrate 101 that becomes the $n^+$-type drain region, the $n^-$-type drift layer 102 doped with $5\times10^{15}$/$cm^3$ of nitrogen (N) is deposited (formed) by epitaxial growth to have thickness of 10 μm. The p-type semiconductor region 103 is selectively formed in the surface of the $n^-$-type drift layer 102 by ion implantation of a p-type impurity. On the $n^-$-type drift layer 102, the $p^-$-type well layer 104 doped with $5\times10^{15}$/$cm^3$ of aluminum (Al) is deposited by epitaxial growth so as to cover the p-type semiconductor region 103 and have a thickness of 0.5 μm.

The JFET region 107 is selectively formed in the $p^-$-type well layer 104 by ion implantation of nitrogen, the JFET region 107 penetrates the $p^-$-type well layer 104 in the depth direction (base depth direction) and reaches the $n^-$-type drift layer 102. Next, the $n^+$-type source region 106 is selectively formed in the $p^-$-type well layer 104 and away from the JFET region 107 by ion implantation of phosphorus (P). Further, the $p^+$-type contact region 105 is selectively formed in the $p^-$-type well layer 104 by ion implantation of aluminum and contacts the $n^+$-type source region 106. Next, activation annealing (heat treatment) is performed at temperature of 1600 degrees C. in an atmosphere of argon (Ar).

Next, by thermal oxidation in an atmosphere of nitrous oxide, on a surface of a portion of the p⁻-type well layer 104 between the n⁺-type source region 106 and the JFET region 107, the gate insulating film 108 is formed to have a thickness of 70 nm. A poly-silicon (poly-Si) layer that becomes the gate electrode 109 is formed on the gate insulating film 108. Next, on the entire front surface of the silicon carbide semiconductor base, the interlayer insulating film 110 is formed so as to cover the gate electrode 109. A contact hole is formed by photolithography and etching to penetrate the interlayer insulating film 110 in the depth direction whereby the p⁺-type contact region 105 and the n⁺-type source region 106 are exposed in the contact hole.

On the silicon carbide semiconductor portion exposed in the contact hole, a nickel (Ni) film is formed, and the nickel silicide layer 111 is formed by sintering (heat treatment). Next, on the interlayer insulating film 110 and the nickel silicide layer 111, an aluminum layer that becomes the source electrode 112 is deposited to have a thickness of 5.0 μm. On the source electrode 112, a polyimide layer that becomes the passivation protective film 114 is formed and the passivation protective film 114 is hardened (cured) by heat treatment at a temperature of 380 degrees C. Thereafter, on the rear surface of the silicon carbide semiconductor base, the rear electrode 113 is formed, completing the SiC-vertical MOSFET depicted in FIG. 6.

SUMMARY OF THE INVENTION

According to one aspect of the present invention, a silicon carbide semiconductor device includes an insulated gate structure having, as a gate insulating film, a silicon dioxide film contacting a silicon carbide semiconductor portion; an interlayer insulating film covering the insulated gate structure; a poly-silicon film provided on a surface of the interlayer insulating film; a first main electrode provided on a surface of the poly-silicon film, the first main electrode being electrically connected to the silicon carbide semiconductor portion; a first titanium film provided between the poly-silicon film and the first main electrode; a titanium nitride film provided between the first titanium film and the first main electrode; and a second titanium film provided between the titanium nitride film and the first main electrode. Between the second titanium film and the first main electrode, an alloy layer is formed by causing the second titanium film and the first main electrode to react.

In the silicon carbide semiconductor device, the poly-silicon film has a thickness of 0.2 μm to 1.0 μm.

In the silicon carbide semiconductor device, the poly-silicon film has a thickness of 0.5 μm or greater.

The silicon carbide semiconductor device includes a semiconductor substrate containing a silicon carbide semiconductor; an n-type drift layer containing a silicon carbide semiconductor and provided on a first main surface of the semiconductor substrate; a p-type semiconductor region selectively provided on an opposite side of the n-type drift layer from a semiconductor substrate side, the p-type semiconductor region constituting the silicon carbide semiconductor portion; an n-type semiconductor region selectively provided in the p-type semiconductor region, the n-type semiconductor region constituting the silicon carbide semiconductor portion; the gate insulating film provided on a surface of a portion of the p-type semiconductor region between the n-type drift layer and the n-type semiconductor region; a gate electrode provided on the gate insulating film and constituting the insulated gate structure; the first main electrode electrically connected to the n-type semiconductor region; and a second main electrode provided on a second main surface of the semiconductor substrate.

In the silicon carbide semiconductor device, the semiconductor substrate is an n-type and has an impurity concentration that is higher than that of the n-type drift layer.

According to another aspect of the present invention, a method of manufacturing a silicon carbide semiconductor device includes thermally oxidizing a silicon carbide semiconductor portion and forming a silicon dioxide film on a surface of the silicon carbide semiconductor portion; forming an insulated gate structure that uses the silicon dioxide film as a gate insulating film; forming an interlayer insulating film so as to cover the insulated gate structure; forming a poly-silicon film on the interlayer insulating film; forming a first titanium film on the poly-silicon film; forming a titanium nitride film on the first titanium film; forming a second titanium film on the titanium nitride film; forming a first main electrode on the second titanium film; and causing the second titanium film and the first main electrode to react, forming an alloy layer between the second titanium film and the first main electrode.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 6 is a cross-sectional view of a structure of a conventional silicon carbide semiconductor device.

DETAILED DESCRIPTION OF THE INVENTION

Figure 1:
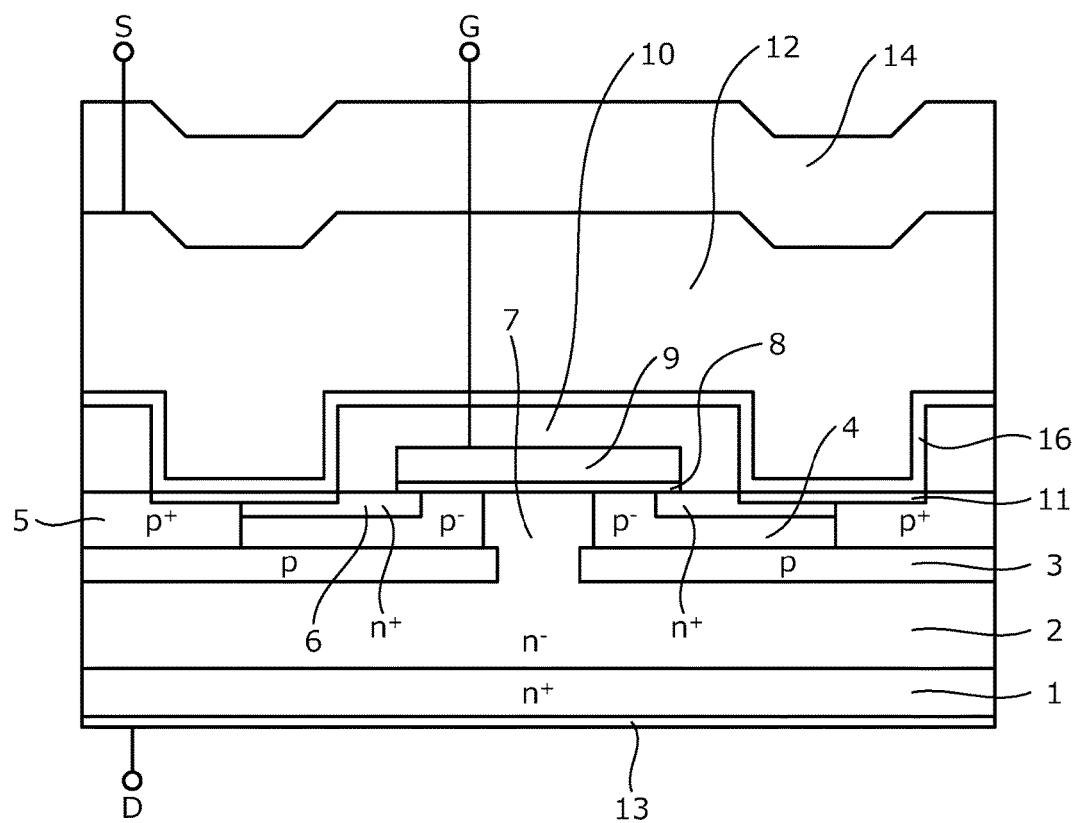
FIG. 1 is a cross-sectional view of a structure of a silicon carbide semiconductor device according to a first embodiment.

Embodiments of a silicon carbide semiconductor device and method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "-" means a bar added to an index immediately after the "-", and a negative index is expressed by prefixing "-" to the index.

A structure of the silicon carbide semiconductor device according to a first embodiment will be described taking a planar gate structure SiC-vertical MOSFET as an example.

FIG. 1 is a cross-sectional view of the structure of the silicon carbide semiconductor device according to the first embodiment. In FIG. 1, an active region that bears driving current (region through which current flows in an on-state) is depicted for one unit cell (semiconductor element functional unit), and other unit cells arranged adjacent to this unit cell and an edge termination structure portion surrounding the active region are omitted from the drawing (similarly, in FIGS. 2, 3). The edge termination structure portion is a region that mitigates the electric field of a base front surface side of an n⁻-type drift layer 2 and, for example, has an edger termination structure combined with a guard ring, a field plate, RESURF, and the like.

In the silicon carbide semiconductor device depicted in FIG. 1, on a front surface of an n⁺-type silicon carbide substrate 1 that becomes an n⁺-type drain region, an n⁻-type silicon carbide epitaxial layer that becomes the n⁻-type drift layer 2 is deposited. In a surface layer on an opposite side of the n⁻-type drift layer 2 from an n⁺-type silicon carbide substrate 1 side, a p-type semiconductor region 3 is selectively provided. On a surface on an opposite side of the n⁻-type drift layer 2 from the n⁺-type silicon carbide substrate 1 side, a p⁻-type silicon carbide epitaxial layer that becomes a p⁻-type well layer 4 is deposited so as to cover the p-type semiconductor region 3. The p-type semiconductor region 3 and the p⁻-type well layer 4 function as a base region (p-type semiconductor region).

The p-type semiconductor region 3 has an impurity concentration that, for example, may be higher than an impurity concentration of the p⁻-type well layer 4. As a result, when a high reverse bias is applied to a pn junction between the p-type semiconductor region 3 and the n⁻-type drift layer 2, punchthrough of the p⁻-type well layer 4 may be prevented. In the p⁻-type well layer 4, an n⁻-type region (JFET region) 7 that penetrates the p⁻-type well layer 4 in a depth direction and reaches the n⁻-type drift layer 2 is selectively formed. In other words, the JFET region 7 is provided on the surface of a portion of the n⁻-type drift layer 2 between adjacent p-type semiconductor regions 3 and has functions as a drift region with the n⁻-type drift layer 2. The JFET region 7 has an impurity concentration that may be, for example, higher than an impurity concentration of the n⁻-type drift layer 2 to reduce the JFET resistance.

In a portion of the p⁻-type well layer 4 facing the p-type semiconductor region 3 in the depth direction, a p⁺-type contact region 5 and an n⁺-type source region (n-type semiconductor region) 6 are selectively provided. The p⁺-type contact region 5 is provided so as to contact the n⁺-type source region 6, the p⁺-type contact region 5 contacting the n⁺-type source region 6 on an opposite side from a JFET region 7 side, for example. Further, the p⁺-type contact region 5 may be provided so as to penetrate the p⁻-type well layer 4 and reach the p-type semiconductor region 3. On the surface of a portion of the p⁻-type well layer 4 between the JFET region 7 and the n⁺-type source region 6, a gate electrode 9 is provided so as to extend onto the JFET region 7 and onto the n⁺-type source region 6, via a gate insulating film 8.

The gate insulating film 8 is a silicon dioxide (SiO₂) film formed by thermally oxidizing a front surface (surface of a p⁻-type well layer 4 side) of a silicon carbide semiconductor base (stacked base constituted by the sequentially stacked n⁺-type silicon carbide substrate 1, n⁻-type drift layer 2, and p⁻-type well layer 4). In this manner, on the front surface side of the silicon carbide semiconductor base (semiconductor chip), a MOS gate structure constituted by silicon carbide semiconductor portions (i.e., a silicon carbide semiconductor structure, including semiconductor regions such as the p-type semiconductor regions 3, the p⁻-type well layer 4, the n⁺-type source region 6, and the like), the gate insulating film 8, and the gate electrode 9 is provided. An interlayer insulating film 10 is provided so as to cover the gate electrode 9. A contact hole that penetrates the interlayer insulating film 10 in the depth direction and reaches the p⁺-type contact region 5 and the n⁺-type source region 6 is provided. On a silicon carbide semiconductor portion exposed in the contact hole, a nickel silicide (NiSi) layer 11 that forms an ohmic contact with the silicon carbide semiconductor portion is provided.

On the surface of the interlayer insulating film 10 and the nickel silicide layer 11, a poly-silicon (poly-Si) film 16 is provided. The poly-silicon film 16 has a function of absorbing hydrogen (H) atoms/hydrogen ions generated from inside a source electrode 12 described hereinafter and having aluminum (Al) as a main constituent. Therefore, hydrogen atoms/hydrogen ions generated from inside the source electrode 12 are suppressed from moving into an interface (SiO₂/SiC interface) of the gate insulating film 8 and the silicon carbide semiconductor portion, or into the gate insulating film 8. As a result, the generation of positive charge by hydrogen atoms/hydrogen ions maybe suppressed. Hydrogen atoms/hydrogen ions are particles having hydrogen atoms as the smallest constituent unit and in particular, are hydrogen atoms, hydrogen ions, and hydrogen molecules.

Further, the poly-silicon film 16 is electrically insulated from the gate electrode 9 by the interlayer insulating film 10 and functions as source wiring. The poly-silicon film 16 may have a thickness about, for example, 0.2 μm or more and 1.0 μm or less, and more particularly may have a thickness of 0.5 μm or more. The reason is as follows. By making the thickness of the poly-silicon film 16 0.2 μm or more, the hydrogen (H) atoms/hydrogen ions absorbing function is sufficiently obtained.

On the surface of the poly-silicon film 16, a source electrode (first main electrode) 12 having aluminum as a main constituent is provided so as to be embedded in the contact hole. The source electrode 12 is electrically connected to the p⁺-type contact region 5 and the n⁺-type source region 6, via the poly-silicon film 16 and the nickel silicide layer 11. The source electrode 12 functions as source wiring. On the source electrode 12, a passivation protective film 14 that protects the chip front surface is provided. On a rear surface of silicon carbide semiconductor base (surface on the n⁺-type silicon carbide substrate 1 side, i.e., a rear surface of the n⁺-type silicon carbide substrate 1), a rear electrode 13 that becomes a drain electrode (second main electrode) is provided.

The method of manufacturing a silicon carbide semiconductor device according to the first embodiment will be described. First, the n⁺-type silicon carbide substrate (semiconductor wafer) 1 of four layer periodic hexagonal silicon carbide (4H-SiC) and becoming the n⁺-type drain region, for example, is prepared. The front surface of the n⁺-type silicon carbide substrate 1 may be, for example, a (000-1) face (so-called, C-face). Next, on the front surface of the n⁺-type silicon carbide substrate 1, the n⁻-type drift layer 2 doped with, for example, 5×10¹⁵/cm³ of an n-type impurity such as nitrogen (N) is deposited (formed) by epitaxial growth to have a thickness of, for example, about 10 μm.

In the surface layer of the n⁻-type drift layer 2, the p-type semiconductor region 3 is selectively formed by ion implantation of a p-type impurity. On the n⁻-type drift layer 2, the p⁻-type well layer 4 doped with, for example, a p-type impurity such as $5\times10^{15}/cm^3$ of aluminum (Al) is deposited by epitaxial growth so as to cover the p-type semiconductor region 3 and have a thickness of, for example, about 0.5 μm. By the processes up to here, the silicon carbide semiconductor base (epitaxial wafer) constituted by the sequentially stacked $n^+$-type silicon carbide substrate 1, $n^-$-type drift layer 2, and $p^-$-type well layer 4 is formed.

Next, for example, in the $p^-$-type well layer 4, the JFET region 7 is selectively formed by ion implantation of an n-type impurity such as nitrogen, the JFET region 7 penetrating the $p^-$-type well layer 4 in the depth direction (base depth direction) and reaching the $n^-$-type drift layer 2. Next, for example, in the $p^-$-type well layer 4, the $n^+$-type source region 6 is selectively formed away from the JFET region 7 by ion implantation of an n-type impurity such as phosphorus (P). Further, for example, in the $p^-$-type well layer 4, for example, the $p^+$-type contact region 5 is selectively formed by ion implantation of a p-type impurity such as aluminum, the $p^+$-type contact region 5 being formed so as to contact the $n^+$-type source region 6. Next, for example, activation annealing (heat treatment) at a temperature of 1600 degrees C. in an atmosphere of argon (Ar) is performed.

Next, for example, on the surface of a portion of the $p^-$-type well layer 4 between the $n^+$-type source region 6 and the JFET region 7, the gate insulating film 8 is formed to have a thickness of, for example, about 70 nm, the gate insulating film 8 being formed by thermal oxidation in a nitrous oxide ($N_2O$) atmosphere. Next, on the gate insulating film 8, a poly-silicon layer that becomes the gate electrode 9 is formed. Next, on the entire front surface (surface on the $p^-$-type well layer 4 side) of the silicon carbide semiconductor base, the interlayer insulating film 10 is formed so as to cover the gate electrode 9. Next, a contact hole is formed by photolithography and etching to penetrate the interlayer insulating film 10 in the depth direction, exposing the $p^+$-type contact region 5 and the $n^+$-type source region 6 in the contact hole. Next, on the silicon carbide semiconductor portion exposed in the contact hole, a nickel (Ni) film is formed, silicon carbide semiconductor portion and the nickel film are caused to react by sintering (heat treatment), and the nickel silicide layer 11 is formed to have a thickness of, for example, 1.0 μm. Before the sintering, on the entire rear surface of the silicon carbide semiconductor base (rear surface of the $n^+$-type silicon carbide substrate 1), the rear electrode 13 is formed.

Next, for example, by low-pressure chemical vapor deposition (CVD), on the interlayer insulating film 10 and the nickel silicide layer 11, for example, the poly-silicon film 16 doped with an n-type impurity such as phosphorus is deposited (formed) to have a thickness of, for example, about 0.2 μm. Next, for example, the poly-silicon film 16 is subject to annealing (heat treatment) at a temperature of about 800 degrees C. As a result, sheet resistance of the poly-silicon film 16, for example, becomes about 50Ω/□ (Ω/square) or less. By depositing the poly-silicon film 16 by low-pressure CVD, the poly-silicon film 16 may be formed to be stable, resistant to cracking, and to have favorable step coverage.

Next, for example, on the poly-silicon film 16, metal layer (hereinafter, aluminum layer) having aluminum as a main constituent and becoming the source electrode 12 is deposited by a sputtering method to have, for example, a thickness of 5.0 μm. Next, the source wiring of a predetermined pattern is formed by pattering the source electrode 12 by photolithography and etching. Next, on the source electrode 12, a polyimide layer that becomes the passivation protective film 14 is formed and, for example, the passivation protective film 14 is hardened (cured) by heat treatment at a temperature of about 380 degrees C. Thereafter, silicon carbide semiconductor base is cut (diced) into individual chips whereby the SiC-vertical MOSFET depicted in FIG. 1 is completed.

In the silicon carbide semiconductor device according to the first embodiment, although hydrogen atoms/hydrogen ions are generated from inside the source electrode 12 under high-temperature operation, these hydrogen atoms/hydrogen ions are absorbed by the poly-silicon film 16 beneath the source electrode 12. Therefore, the hydrogen atoms/hydrogen ions generated from inside the source electrode 12 do not diffuse near the gate insulating film 8 or inside the gate insulating film 8. SiC-vertical MOSFETs were produced according the method of manufacturing a silicon carbide semiconductor device according to the first embodiment described above and according to various conditions given as examples, and variation of threshold voltage was measured with respect to the SiC-vertical MOSFETs. The results confirmed that after negative voltage of $-3$ MV/cm is applied to the gate electrode 9 for 1000 hours under high-temperature operation in which the operating temperature is 200 degrees C., the variation range of the threshold voltage could be suppressed to 0.1V or less.

As described, according to the first embodiment, by provided the poly-silicon film beneath the source electrode, hydrogen atoms/hydrogen ions generated from inside the source electrode under high-temperature operation are absorbed by the poly-silicon film beneath the source electrode. Therefore, the hydrogen atoms/hydrogen ions generated from inside the source electrode under high-temperature operation may be suppressed from moving to the gate insulating film side and diffusing into the gate insulating film. As a result, the generation of positive charge near the interface of the gate insulating film and the silicon carbide semiconductor portion or inside the gate insulating film may be suppressed, enabling the variation range of the threshold voltage when negative voltage is applied to the gate electrode to be reduced. In other words, a gate insulating film for which the threshold voltage is stable may be formed. Therefore, even in cases where either positive or negative voltage is applied to the gate electrode, variation of the threshold voltage may be suppressed, enabling a highly reliable silicon carbide semiconductor device to be provided that has stable electrical characteristics. Further, according to the first embodiment, by forming the poly-silicon film beneath the source electrode by CVD, a stable poly-silicon film that is resistant to cracking and has favorable step coverage may be formed thereby, enabling variation of the threshold voltage to be suppressed.

Figure 2:
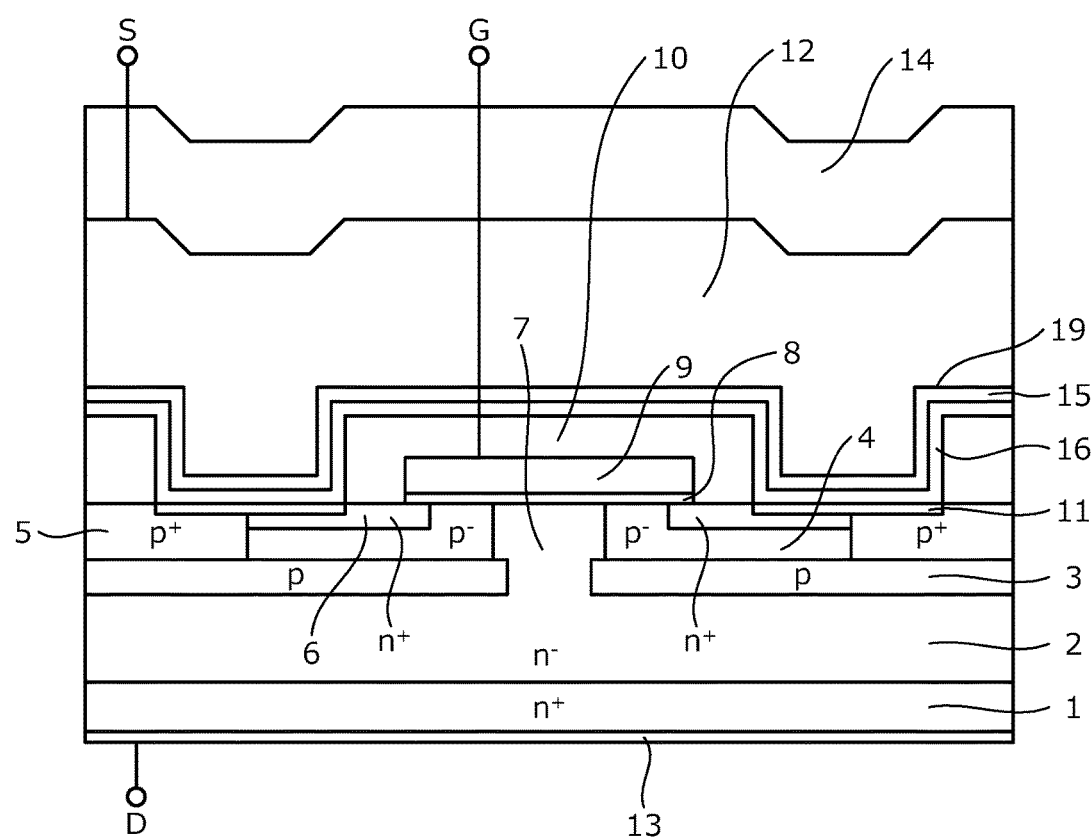
FIG. 2 is a cross-sectional view of a structure of the silicon carbide semiconductor device according to a second embodiment.

A structure of the silicon carbide semiconductor device according to a second embodiment will be described. FIG. 2 is a cross-sectional view of the structure of the silicon carbide semiconductor device according to the second embodiment. The silicon carbide semiconductor device according to the second embodiment differs from the silicon carbide semiconductor device according to the first embodiment in that between the poly-silicon film 16 and the source electrode 12, a metal film (hereinafter, titanium film) 15 having titanium (Ti) as a main constituent is provided. The titanium film 15 has a function of blocking hydrogen atoms/hydrogen ions generated from inside the source electrode 12. In other words, a diffusion coefficient of the hydrogen atoms/hydrogen ions inside the titanium film 15 is small to an extent that hydrogen atoms/hydrogen ions moving in the titanium film 15 substantially do not reach the poly-silicon film 16 below.

The method of manufacturing a silicon carbide semiconductor device according to the second embodiment, for example, is a method where in the method of manufacturing a silicon carbide semiconductor device according to the first embodiment, after the poly-silicon film 16 is formed and before the source electrode 12 is formed, the titanium film 15 is deposited (formed) on the poly-silicon film 16. In other words, the poly-silicon film 16, the titanium film 15, and the source electrode 12 are sequentially deposited as source wiring. Respective thicknesses of the poly-silicon film 16, the titanium film 15, and the source electrode 12 at the time of deposition, for example, may be 0.3 µm, 0.1 µm, and 5.0 µm, respectively. An alloy layer 19 is formed between the titanium film 15 and the source electrode 12 by causing the titanium film 15 and the source electrode 12 to react.

As described, according to the second embodiment, effects identical to those of the first embodiment may be obtained. Further, according to the second embodiment, hydrogen atoms/hydrogen ions generated from inside the source electrode under high-temperature operation are blocked by the titanium film beneath the source electrode. Therefore, movement of the hydrogen atoms/hydrogen ions from inside the source electrode to the gate insulating film side may be suppressed, enabling variation of the threshold voltage to be further reduced.

Figure 3:
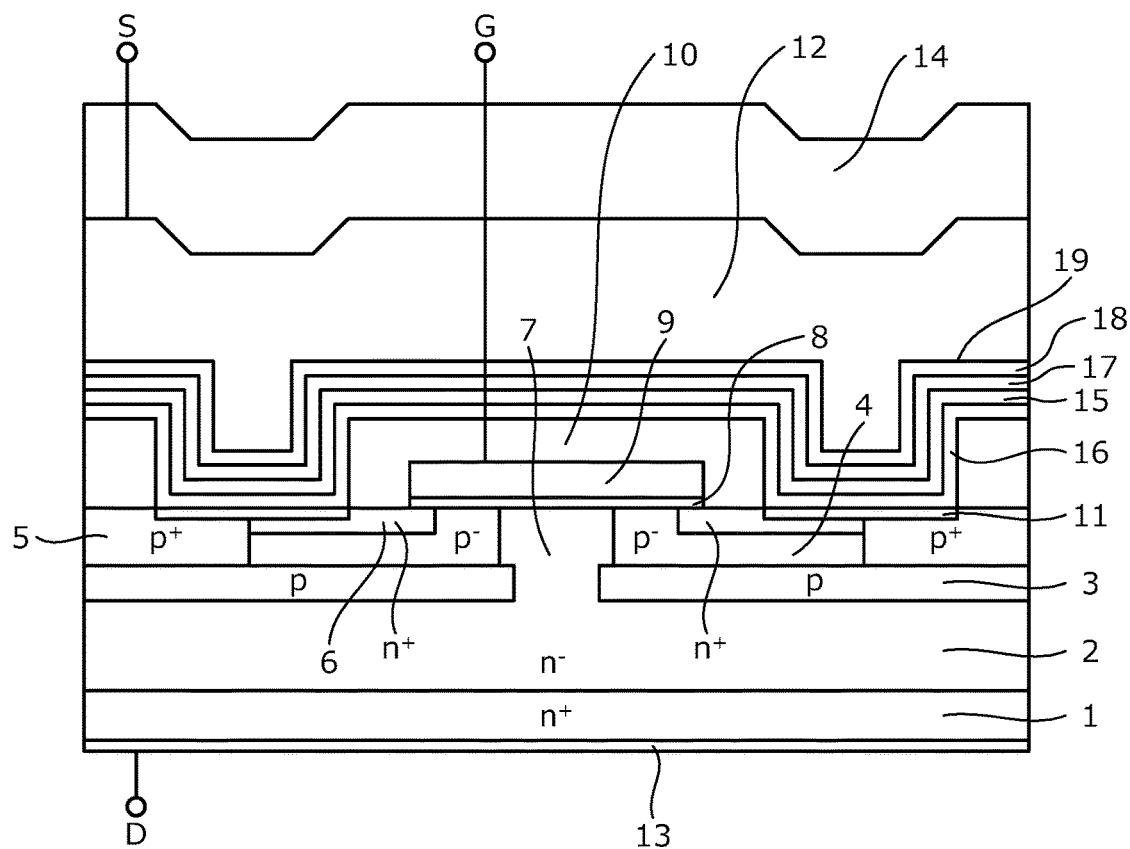
FIG. 3 is a cross-sectional view of a structure of the silicon carbide semiconductor device according to a third embodiment.

A structure of the silicon carbide semiconductor device according to a third embodiment will be described. FIG. 3 is a cross-sectional view of the structure of the silicon carbide semiconductor device according to the third embodiment. The silicon carbide semiconductor device according to the third embodiment differs from the silicon carbide semiconductor device according to the second embodiment in that a metal film (hereinafter, titanium nitride film) 17 having titanium nitride (TiN) as a main constituent, and a second titanium film 18 are provided between the titanium film (hereinafter, first titanium film) 15 and the source electrode 12. The titanium nitride film 17 and the second titanium film 18 have a function of absorbing hydrogen atoms/hydrogen ions generated from inside the source electrode 12.

The method of manufacturing a silicon carbide semiconductor device according to the third embodiment, for example, is a method where in the method of manufacturing a silicon carbide semiconductor device according to the first embodiment, after the first titanium film 15 is formed and before the source electrode 12 is formed, the titanium nitride film 17 and the second titanium film 18 are deposited (formed) on the first titanium film 15. In other words, the poly-silicon film 16, the first titanium film 15, the titanium nitride film 17, the second titanium film 18, and the source electrode 12 are sequentially deposited as source wiring. Although not depicted, the structure may be one in which the second titanium film 18 is not provided. Respective thicknesses of the poly-silicon film 16, the first titanium film 15, the titanium nitride film 17, the second titanium film 18, and the source electrode 12 at the time of deposition, for example, may be 0.3 µm, 0.1 µm, 0.1 µm, 0.1 µm, and 5.0 µm, respectively. The alloy layer 19 is formed between the second titanium film 18 and the source electrode 12 by causing the second titanium film 18 and the source electrode 12 to react.

As described, according to the third embodiment, effects identical to those of the first and the second embodiment may be obtained. Further, according to the third embodiment, movement of hydrogen atoms/hydrogen ions from inside the source electrode to the gate insulating film side may be suppressed by the titanium nitride film and second titanium film between the source electrode and the first titanium film, enabling variation of the threshold voltage to be further reduced.

Figure 4:
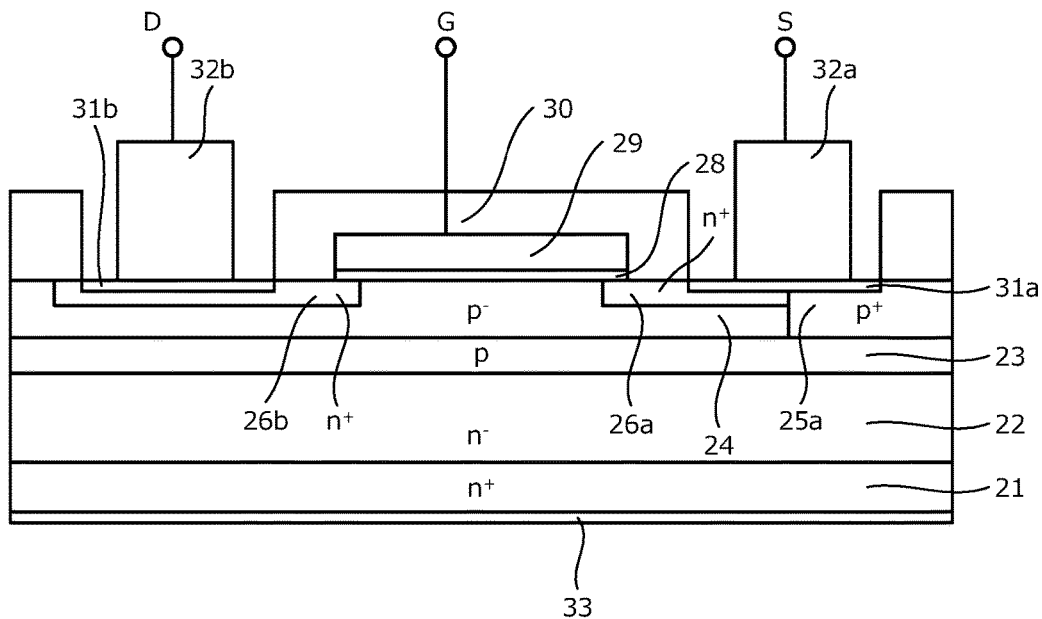
FIG. 4 is a cross-sectional view of a structure of a silicon carbide semiconductor device of a comparison example 1.
Figure 5:
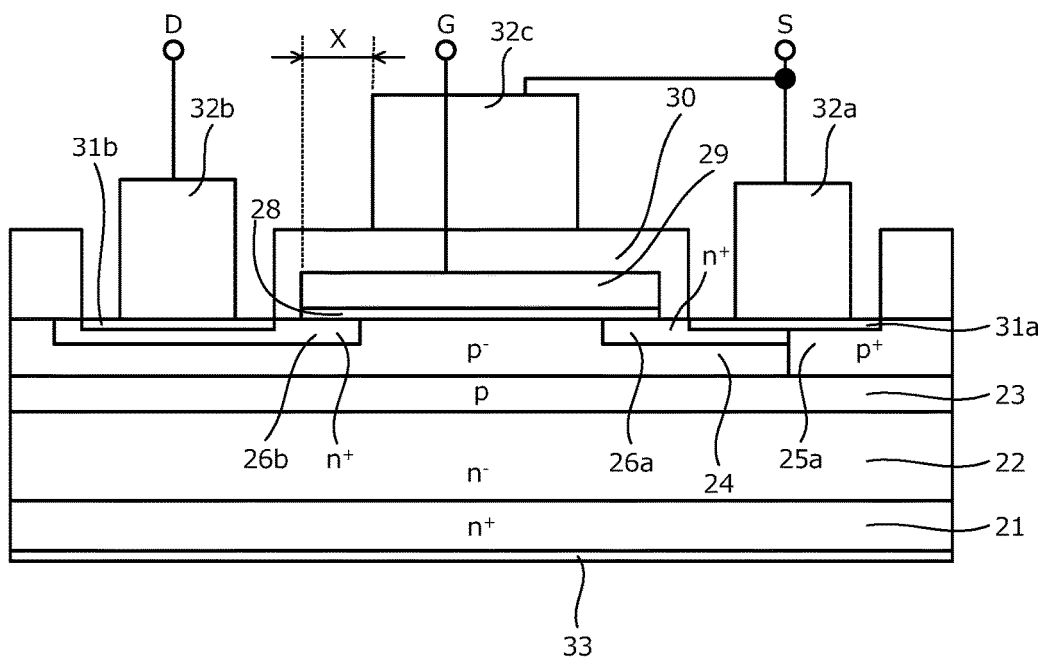
FIG. 5 is a cross-sectional view of a structure of a silicon carbide semiconductor device of a comparison example 2.

An example will be described. The cause of variation of the threshold voltage in a conventional SiC-MOSFET (hereinafter, conventional example; refer to FIG. 6) will be described. In the conventional example, the interface state density of the $SiO_2$/SiC interface being high is a problem particular to the $SiO_2$/SiC interface and at present, it is not clear if the interface state density is high from differences in the band structure, the amount of distortion, and the amount of defects of the $SiO_2$/SiC interface. Thus, arrangement of the aluminum layer formed as electrode layers was variously changed and the cause of threshold voltage variation in the conventional example was verified. FIG. 4 is a cross-sectional view of the structure of a silicon carbide semiconductor device of a comparison example 1. FIG. 5 is a cross-sectional view of the structure of a silicon carbide semiconductor device of a comparison example 2. As depicted in FIG. 4, a SiC-horizontal MOSFET (hereinafter, the comparison example 1) of a planar gate structure was produced in which the electrode layer and the interlayer insulating film 30 do not contact each other in the contact hole, and no electrode layer (aluminum layer) is arranged on an interlayer insulating film 30.

The comparison example 1 is a horizontal-type MOS gate structure of the conventional example. Thicknesses and impurity concentrations of regions of the comparison example 1 are respectively the same as the thicknesses and the impurity concentrations of the corresponding regions of the conventional example. Further, in the comparison example 1, an electrode layer (a source electrode 32a and a drain electrode 32b) and the interlayer insulating film 30 are arranged so as to not contact each other. In particular, first, on a front surface of an $n^+$-type silicon carbide substrate 21, a silicon carbide epitaxial layer that becomes an $n^-$-type drift layer 22 is deposited. Next, in the surface layer of the $n^-$-type drift layer 22, a p-type semiconductor region 23 is formed by ion implantation. On the p-type semiconductor region 23, a silicon carbide epitaxial layer that becomes a $p^-$-type well layer 24 is deposited.

In the $p^-$-type well layer 24, an $n^+$-type source region 26a and an $n^+$-type drain region 26b are each selectively formed by ion implantation of phosphorus. Further, in the $p^-$-type well layer 24, a $p^+$-type contact region 25a is selectively formed by ion implantation of aluminum. The $p^+$-type contact region 25a is arranged at a position that is farther away from a gate electrode 29 described hereinafter than the $n^+$-type source region 26a is, the $p^+$-type contact region 25a being arranged so as to contact the $n^+$-type source region 26a. Next, activation annealing is performed at a temperature of 1600 degrees C. in an argon atmosphere.

Next, on a surface of a portion of the $p^-$-type well layer 24 between the $n^+$-type source region 26a and the $n^+$-type drain region 26b, a gate insulating film 28 is formed by thermal oxidation in a nitrous oxide atmosphere. On the gate insulating film 28, a poly-silicon layer that becomes the gate electrode 29 is formed. The interlayer insulating film 30 is formed so as to cover the gate electrode 29. Next, first and second contact holes are formed by photolithography and etching to penetrate the interlayer insulating film 30 in a depth direction, exposing the $p^+$-type contact region 25a and the $n^+$-type source region 26a in the first contact hole and exposing the $n^+$-type drain region 26b in the second contact hole.

Next, on each silicon carbide semiconductor portion exposed in the first and the second contact holes, a nickel film is formed and nickel silicide layers 31a, 31b are formed by performing sintering and causing the silicon carbide semiconductor portions and the nickel films to react. Before the sintering, on a rear surface of the n⁺-type silicon carbide substrate 21, a rear electrode 33 is formed. On the interlayer insulating film 30 and the nickel silicide layers 31, an aluminum layer is deposited and patterned to leave only in the first and second contact holes, the aluminum layer forming the source electrode 32a and the drain electrode 32b. At this time, the source electrode 32a and the drain electrode 32b are formed to be away from the interlayer insulating film 30 so as to not contact the interlayer insulating film 30. Thereafter, the silicon carbide semiconductor base is cut into individual chips whereby the SiC-horizontal MOSFET of the comparison example 1 depicted in FIG. 4 is completed.

Further, as depicted in FIG. 5, a SiC-horizontal MOSFET of a planar gate structure in which an electrode layer 32c of the source potential is arranged on the surface of a portion of the interlayer insulating film 30 on the gate electrode 29 (hereinafter, comparison example 2) was produced. Configuration of the comparison example 2 excluding the electrode layer 32c is the same as that of the comparison example 1. A method of manufacturing the comparison example 2 may be a method of further leaving the aluminum layer on the interlayer insulating film 30 to form the electrode layer 32c when the aluminum layer deposited on the interlayer insulating film 30 and the nickel silicide layers 31 is patterned and the source electrode 32a and the drain electrode 32b are formed. The electrode layer 32c faces the gate electrode 29 in the depth direction, via the interlayer insulating film 30.

Further, the comparison example 2 is structured so that a distance X from an end of the electrode layer 32c to an end of the gate electrode 29 is 100 μm or more, and so that hydrogen atoms/hydrogen ions generated from the interface of the interlayer insulating film 30 and the electrode layer 32c or from inside the electrode layer 32c are suppressed from diffusing from near the end of the gate electrode 29 into the gate insulating film 28. The distance X from the end of the electrode layer 32c to the end of the gate electrode 29 is a distance from the end of the source electrode 32a side of the electrode layer 32c to the end on the source electrode 32a side of the gate electrode 29, and a distance from the end of the drain electrode 32b side of the electrode layer 32c to the end of the drain electrode 32b side of the gate electrode 29.

With respect to the comparison examples 1, 2, variation of the threshold voltage was measured after applying a negative voltage of −3 MV/cm to the gate electrode 29 for 10 minutes under high-temperature operation in which the operating temperature was 200 degrees C. The result for both of the comparison examples 1, 2 was a threshold voltage variation range of ±0.1V. In the comparison example 1 of a configuration in which the electrode layer (the source electrode 32a and the drain electrode 32b) and the interlayer insulating film 30 do not contact each other in this manner, it was confirmed that the threshold voltage does not vary. Further, it was confirmed that even in a configuration in which the electrode layer and the interlayer insulating film contact each other, the threshold voltage does not vary consequent to the arrangement of the electrode layer 32c on the surface of the portion of the interlayer insulating film 30 on the gate electrode 29 as in the comparison example 2.

Further, with respect to the comparison example 2 in which the interlayer insulating film 30 and the electrode layer 32c contact each other, elemental analysis of the interface of the interlayer insulating film 30 and the electrode layer 32c, and of the inside of the electrode layer 32c was performed by thermal desorption spectroscopy (TDS). The results reveal that when the chip temperature was raised to 200 degrees C. or higher, hydrogen molecules at an impurity concentration of $3 \times 10^{14}/cm^2$ or higher were detected. The generation of hydrogen atoms/hydrogen ions from the interface of the interlayer insulating film 30 and the electrode layer 32c and from the electrode layer 32c is thought to occur consequent to a reaction of aluminum, which is a constituent material of the electrode layer 32c and water ($H_2O$) included in the vapor atmosphere during thermal oxidation.

Further, poly-silicon, which is a constituent material of the gate electrode 29 has a grain boundary and at this grain boundary, a dangling bond is present. A dangling bond of the grain boundary of poly-silicon is known to be terminated by hydrogen atoms when hydrogen is introduced. Therefore, the threshold voltage of the comparison example 2 not varying indicates that hydrogen atoms/hydrogen ions generated from the interface of the interlayer insulating film 30 and the electrode layer 32c or from inside the electrode layer 32c terminate dangling bonds of the grain boundary of poly-silicon, which is a constituent material of the gate electrode 29, whereby the hydrogen atoms/hydrogen ions are absorbed by the poly-silicon and substantially, do not diffuse into the gate insulating film 28.

Further, in general, when a SiC-MOSFET is manufactured, a majority of the hydrogen ions are taken in by the $SiO_2$/SiC interface consequent to an annealing process at a high temperature of 800 degrees C. or higher, or a thermal oxidation process for oxide film formation at a high temperature of 800 degrees C. or higher. The hydrogen ions taken in by the $SiO_2$/SiC interface consequent to the high-temperature heat treatment of 800 degrees C. or higher, bond with dangling bonds of the $SiO_2$/SiC interface, forming silicon-hydrogen (Si—H) bonds and carbon-hydrogen (C—H) and becoming fixed. In this manner, hydrogen atoms of silicon-hydrogen bonds and carbon-hydrogen bonds formed at the $SiO_2$/SiC interface by high-temperature heat treatment do not change (dissociate) under low-temperature heat treatment of 400 degrees C. or less.

On the other hand, the electrode layer (aluminum layer for wiring) is deposited on the interlayer insulating film by low-heat treatment of 400 degrees C. or less. When the electrode layer is deposited by low-temperature heat treatment, hydrogen atoms/hydrogen ions generated from the interface of the interlayer insulating film and electrode layer or from inside the electrode layer are not fixed and move to the $SiO_2$/SiC interface when negative voltage is applied to the gate electrode of the SiC-MOSFET under high-temperature operation. It is surmised that consequent to these hydrogen atoms/hydrogen ions, fixed hydrogen atoms dissociate from silicon-hydrogen bonds and carbon-hydrogen bonds of the $SiO_2$/SiC interface, form dangling bonds ($Si^+$, $C^+$) of silicon atoms and carbon atoms, and generate positive charge near the $SiO_2$/SiC interface or inside the gate insulating film.

For example, the diffusion coefficient of the hydrogen atoms/hydrogen ions in the oxide film ($SiO_2$ film) at 200 degrees C. is $1.0 \times 10^{-8}$ cm²/second and the diffusion length thereof is 24.5 μm for 10 minutes. Therefore, as in the conventional example, when the interlayer insulating film 110 and the source electrode 112 contact each other in the contact hole, the hydrogen atoms/hydrogen ions generated from the interface of the interlayer insulating film 110 and the source electrode 112 or from inside the source electrode 112 under high-temperature operation easily move into the interlayer insulating film 110 and reach the gate insulating film 108 from the end side of the gate electrode 109, causing the threshold voltage to vary.

Such movement of hydrogen atoms/hydrogen ions from inside the electrode layer to the interlayer insulating film, for example, may be blocked by forming a titanium film or a titanium nitride film between the interlayer insulating film and the electrode layer, however, the titanium film or the titanium nitride film, for example, is formed by sputtering and thus, step coverage becomes poor. Further, although a SiC-vertical MOSFET having a structure in which the interlayer insulating film and the electrode layer do not contact each other in the contact hole is possible, the size of the unit cell (unit region in which one MOS gate structure is formed) increases consequent to a gap created between the electrode layer and the contact hole. Consequently, practical use is difficult.

As described, in the present invention, between the interlayer insulating film 10 and the source electrode 12, at least the poly-silicon film 16 is formed that has a function of absorbing hydrogen atoms/hydrogen ions generated from inside the source electrode 12. As a result, for example, when the poly-silicon film 16 has a thickness of 0.3 μm, variation of the threshold voltage after a negative voltage of −3 MV/cm is applied to the gate electrode 9 for 1000 hours under high-temperature operation where the operating temperature is 200 degrees C. may be suppressed to ±0.1V. Further, in the present invention, formation of the poly-silicon film 16 between the interlayer insulating film 10 and the source electrode 12 enables formation of the source electrode 12 without creating a gap between the electrode layer (the source electrode 12) and the side wall of the contact hole whereby increases in the unit cell size may be avoided.

Although the present invention, for example, is particularly effective for elements forming a channel (inversion layer) in a (000-1)-face of a 4-layer periodic hexagonal crystal silicon carbide (4H-SiC) semiconductor (i.e., elements having a C-face as the chip front surface), the same effects are achieved in elements forming a channel in other plane orientations (e.g., (0001)-face (a so-called Si-face), (11-20)-face, (03-38)-face). Further, in the embodiments, although a SiC-vertical MOSFET has been described as an example, the invention is applicable to other MOS-type silicon carbide semiconductor devices such as SiC-horizontal MOSFETs, SiC-IGBTs, etc., and the same effects are obtained. In place of the planar gate structure, even in the case of a trench gate structure, the same effects are obtained. Further, the structure may be such that without providing the p⁻-type well layer, the p⁺-type contact region and the n⁺-type source region are selectively formed in the p⁻ type semiconductor region that functions as a base region. Further, in the embodiments described above, for example, dimensions, impurity concentrations, and the like of constituent parts may be variously set according to required specifications.

However, as a result of extensive research by the inventors, it was found that when the oxide film that becomes the gate insulating film of a SiC-MOSFET is formed by thermal oxidation in an atmosphere that includes nitrous oxide and negative voltage is applied to the gate electrode, the threshold voltage (Vth) varies greatly. In putting a silicon carbide semiconductor device into practical use, achieving high reliability enabling stable operation even during stress application (voltage, temperature) is problematic. For example, in a SiC-power MOSFET, at the time of driving, positive voltage and negative voltage that are also high voltages are applied to the gate electrode. Further, a SiC-power MOSFET has to guarantee operation under high-temperature environments where the junction (joining) temperature is 200 degrees C. or higher.

In particular, electric field strength of about ±2 MV/cm to ±4 MV/cm is applied to the gate insulating film and a guaranteed operating temperature of about 200 degrees C. is required. In this case, under certain conditions, a phenomenon of the threshold voltage greatly varying has been observed. Hereinafter, the results of verification of electrical characteristics of the SiC-power MOSFET obtained by a reliability test will be described. First, according to the conventional method of manufacturing a silicon carbide semiconductor device described above, a SiC-MOSFET was produced (manufactured) under the various conditions described above (hereinafter, conventional example). Concerning this conventional example, under high-temperature operation in which the operating temperature (junction temperature) becomes 200 degrees C., 3 MV/cm (positive voltage) and −3 MV/cm (negative voltage) were each applied for 10 minutes to the gate electrode 109 and threshold voltage variation was observed.

As a result, when positive voltage was applied to the gate electrode 109, variation of the threshold voltage was small and the variation range (amount of variation) was confirmed to be ±0.1V or less. The variation range of the threshold voltage is the difference from the threshold voltage (reference value) at the time of product shipping, based on design conditions. On the other hand, when negative voltage was applied to the gate electrode 109, the threshold voltage varied greatly on the negative side (i.e., the threshold voltage decreased). This phenomenon of the threshold voltage varying on the negative side indicates that near the junction interface (SiO$_2$/SiC interface) of the gate insulating film 108 and the silicon carbide semiconductor portion or in the gate insulating film 108 (SiO$_2$ film), positive charge (holes) are captured and charge, generating a positive fixed charge consequent to the application of negative voltage to the gate electrode 109 under high-temperature operation.

There are few reports of the phenomenon of positive fixed charge being generated in the gate insulating film or at a junction interface (hereinafter, SiO$_2$/Si interface) of the gate insulating film and the silicon semiconductor portion when negative voltage is applied to the gate electrode in a Si-MOSFET or a Si-insulated gate bipolar transistor (IGBT) using a silicon semiconductor. For example, although there are some reports of the phenomenon (slow trap phenomenon) of the gate threshold voltage varying in a Si-p channel-type MOSFET when negative voltage is applied to the gate electrode, the variation range of the threshold voltage is 0.1V even when the operating temperature is 150 degrees C. and a negative voltage of −3 MV/cm is applied to the gate electrode for 1000 hours.

The variation range of the threshold voltage of the SiC-MOSFET under the same conditions (operating temperature of 150 degrees C., gate voltage of −3 MV/cm) is −7V or more and therefore, the variation range of the threshold voltage for the Si-MOSFET and that for the SiC-MOSFET greatly differ. In particular, the interface state density of the SiO$_2$/Si interface in the Si-MOSFET is $1.0 \times 10^{11}$ cm$^{-2}$ eV$^{-1}$ or less. On the other hand, the interface state density of the SiO$_2$/SiC interface in the SiC-MOSFET is $1.0 \times 10^{12}$ cm$^{-2}$ eV$^{-1}$ or more. Although a majority of research is on reducing the interface state density of the SiO$_2$/SiC interface, a technique of reducing the interface state density of the SiO$_2$/SiC interface to about the same extent as the interface state density of the SiO$_2$/Si interface has not been reported.

According to the present invention, under high-temperature operation, hydrogen atoms/hydrogen ions generated from inside the first main electrode are absorbed by the poly-silicon film beneath the first main electrode and therefore, movement of the hydrogen atoms/hydrogen ions to the gate insulating film and diffusion into to the gate insulating film may be suppressed. As a result, the generation of positive charge at the interface of the gate insulating film and the silicon carbide semiconductor portion or inside the gate insulating film may be suppressed, enabling the variation range of the threshold voltage when negative voltage is applied to the gate electrode to be reduced. Further, according to the present invention, since hydrogen atoms/hydrogen ions generated from inside the first main electrode are blocked by the first titanium film between the poly-silicon film and the first main electrode, movement of the hydrogen atoms/hydrogen ions to the gate insulating film side may be further suppressed. As a result, the variation range of the threshold voltage when negative voltage is applied to the gate electrode may be further reduced. Further, according to the present invention, since hydrogen atoms/hydrogen ions generated from inside the first main electrode are absorbed by the second titanium film and the titanium nitride film between the first titanium film and the first main electrode, movement of the hydrogen atoms/hydrogen ions to the gate insulating film side may be further suppressed. As a result, the variation range of the threshold voltage when negative voltage is applied to the gate electrode may be further reduced.

The silicon carbide semiconductor device and the method of manufacturing a silicon carbide semiconductor device according to the present invention achieve an effect in that predetermined electrical characteristics may be stably obtained and reliability may be improved.

As described, the silicon carbide semiconductor device and the method of manufacturing a silicon carbide semiconductor device according to the present invention is useful for power semiconductor devices used in control circuits of automobiles, industrial machines, and the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a silicon carbide semiconductor structure;
an insulated gate structure, including
a gate insulating film, which is a silicon dioxide film contacting the silicon carbide semiconductor structure, and
a gate electrode formed on the gate insulating film;
an interlayer insulating film formed on the insulated gate structure;
a poly-silicon film formed on the interlayer insulating film;
a main electrode formed on the poly-silicon film and in electrical connection with the silicon carbide semiconductor structure;
a titanium film provided between the poly-silicon film and the main electrode;
a titanium nitride film provided between the titanium film and the main electrode;
another titanium film provided between the titanium nitride film and the main electrode; and
an alloy layer formed between the another titanium film and the main electrode due to reaction between the another titanium film and the main electrode.

2. The silicon carbide semiconductor device according to claim 1, wherein the poly-silicon film has a thickness of 0.2 μm to 1.0 μm.

3. The silicon carbide semiconductor device according to claim 1, wherein the poly-silicon film has a thickness of 0.5 μm to 1.0 μm.

4. The silicon carbide semiconductor device according to claim 1, wherein
the main electrode is a first main electrode;
the silicon carbide semiconductor device further includes:
a silicon carbide semiconductor substrate, and
an n-type drift layer and a second main electrode, respectively provided on two opposite surfaces of the silicon carbide semiconductor substrate;
the silicon carbide semiconductor structure includes:
a p-type semiconductor region selectively formed in the n-type drift layer, and
an n-type semiconductor region selectively provided in the p-type semiconductor region;
the gate insulating film covers a surface of a portion of the p-type semiconductor region between the n-type drift layer and the n-type semiconductor region; and
the first main electrode is electrically connected to the n-type semiconductor region.

5. The silicon carbide semiconductor device according to claim 4, wherein
the silicon carbide semiconductor substrate is of an n-type and has an impurity concentration that is higher than that of the n-type drift layer.

6. A method of manufacturing a silicon carbide semiconductor device, comprising:
providing a silicon carbide semiconductor base having a silicon carbide semiconductor structure formed thereon;
forming an insulated gate structure, including
thermally oxidizing the silicon carbide semiconductor structure to form a silicon dioxide film on a surface thereof, and
forming a gate electrode on the silicon dioxide film;
forming an interlayer insulating film to cover the insulated gate structure;
forming a poly-silicon film on the interlayer insulating film;
forming a titanium film on the poly-silicon film;
forming a titanium nitride film on the titanium film;
forming another titanium film on the titanium nitride film;
forming a main electrode on the another titanium film; and
after forming the main electrode, causing the another titanium film and the main electrode to react, to thereby form an alloy layer between the another titanium film and the main electrode.

* * * * *